United States Patent
Chang et al.

(10) Patent No.: US 12,112,796 B2
(45) Date of Patent: Oct. 8, 2024

(54) MEMORY CIRCUIT AND WORD LINE DRIVER

(71) Applicant: TAIWAN SEMICONDUCTOR MANUFACTURING COMPANY LTD., Hsinchu (TW)

(72) Inventors: Zhi-Hao Chang, Yunlin County (TW); Wei-Jer Hsieh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 203 days.

(21) Appl. No.: 17/674,139

(22) Filed: Feb. 17, 2022

(65) Prior Publication Data
US 2023/0260571 A1 Aug. 17, 2023

(51) Int. Cl.
G11C 11/418 (2006.01)
G11C 11/408 (2006.01)
G11C 11/413 (2006.01)
G11C 11/4096 (2006.01)

(52) U.S. Cl.
CPC ........ *G11C 11/418* (2013.01); *G11C 11/4085* (2013.01); *G11C 11/413* (2013.01); *G11C 11/4096* (2013.01)

(58) Field of Classification Search
CPC . G11C 11/418; G11C 11/4085; G11C 11/413; G11C 11/4096; G11C 8/08
See application file for complete search history.

(56) References Cited

U.S. PATENT DOCUMENTS

| | | | | |
|---|---|---|---|---|
| 5,808,954 A | * | 9/1998 | Ichikawa | G11C 8/08 327/535 |
| 6,380,800 B1 | * | 4/2002 | Huber | H02M 1/12 327/552 |
| 2006/0221717 A1 | * | 10/2006 | Lee | G11C 7/1051 365/189.04 |
| 2009/0196115 A1 | * | 8/2009 | Agari | G11C 11/417 365/230.06 |
| 2012/0033522 A1 | * | 2/2012 | Chuang | G11C 8/08 365/230.06 |
| 2013/0128680 A1 | * | 5/2013 | Holla | G11C 11/417 365/206 |
| 2016/0232955 A1 | * | 8/2016 | Yu | G11C 8/08 |
| 2019/0080736 A1 | * | 3/2019 | Baeck | G11C 11/418 |

(Continued)

*Primary Examiner* — Huan Hoang
*Assistant Examiner* — Justin Bryce Heisterkamp
(74) *Attorney, Agent, or Firm* — WPAT LAW; Anthony King

(57) ABSTRACT

The present disclosure provides a memory circuit. The memory circuit includes: a plurality of word lines, a word line driver, and a first conductive line. The word line driver is electrically connected to the word lines. The word line driver includes: a plurality of first electronic components and a plurality of second electronic components. The plurality of first electronic components each electrically connected to the corresponding word line. The plurality of second electronic components each having a first terminal and a second terminal. The first terminal is electrically connected to the corresponding word line and the corresponding first electronic component. The first conductive line is electrically connected to the second terminal of the second electronic components. The first conductive line has a length proportional to the number of the word lines.

20 Claims, 14 Drawing Sheets

(56) References Cited

U.S. PATENT DOCUMENTS

2022/0351772 A1* 11/2022 Lee .................. G11C 11/418
2023/0260570 A1* 8/2023 Lin .................. G11C 11/418
                                                        365/154

* cited by examiner

MEMORY CIRCUIT AND WORD LINE DRIVER

TECHNICAL FIELD

The disclosure relates to a memory circuit, and, more particularly, to a memory circuit including a word line driver.

BACKGROUND

Memorized bits stored in cell storage nodes of memory cells may be influenced by noise induced during a read or write mode (i.e., when the memory cells are connected to bit lines). If the noise-induced change in voltage at the cell storage nodes exceeds the static noise margin (SNM), the memorized bits will be flipped. Such SNM failure can deteriorate integrity of the memorized bits.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
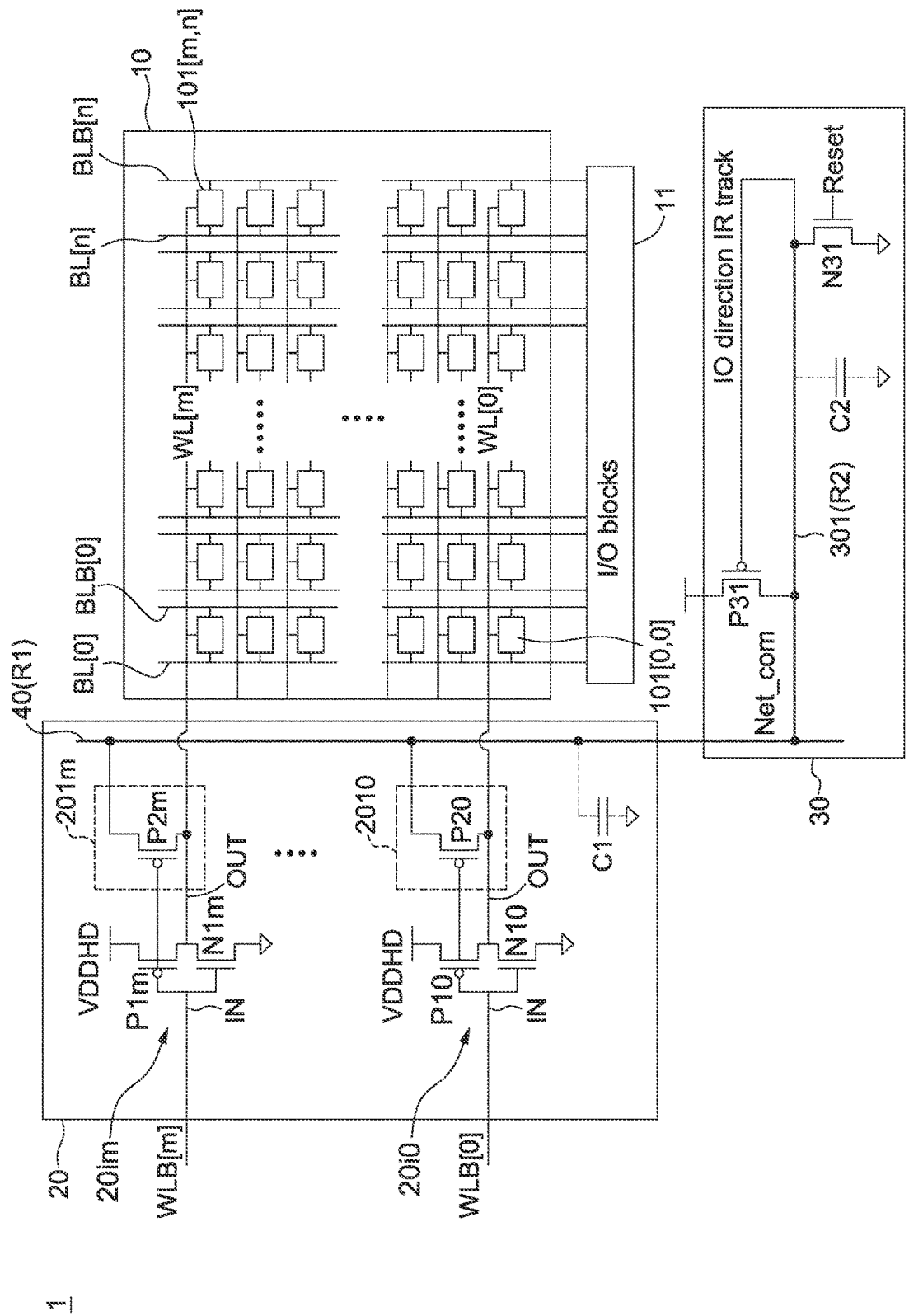
FIG. 1A is a schematic diagram of a memory circuit in accordance with some embodiments of the present disclosure.

The following disclosure provides many different embodiments, or examples, for implementing different features of the provided subject matter. Specific examples of components and arrangements are as follows to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1A is a schematic diagram of a memory circuit 1 in accordance with some embodiments of the present disclosure. The memory circuit 1 includes a memory cell array 10, a plurality of input/output (I/O) blocks 11, a word line driver 20, a clamping circuit 30, and a conductive line 40.

As shown in FIG. 1A, the memory cell array 10 includes a plurality of memory cells 101[0,0], . . . , [m,n] (collectively referred to as "memory cells 101"), wherein m is a positive integer and n is a positive integer. The memory cells have "m" rows and "n" columns. The rows of memory cells 101 in the memory cell array 10 are arranged along a first orientation. The columns of memory cells 101 in the memory cell array 10 are arranged along a second orientation perpendicular to the first.

As shown in FIG. 1A, the memory cell array 10 includes m word lines WL[0] . . . , WL[m] (collectively referred to as "word lines WL"), wherein m is a positive integer. Each of the word lines WL extends along the first orientation and is over a row of the memory cells 101. For example, the word line WL[0] may be over a row 0 of the memory cells 101, i.e., over the memory cells 101[0,0], . . . , 101[0,n].

Referring again to FIG. 1A, the memory cell array 10 includes n bit lines BL[0], . . . , BL[n] (collectively referred to as "bit lines BL"), wherein n is a positive integer. Each of the bit lines BL extends along the second orientation and is over a column of memory cells 101. For example, the bit lines BL[0] may be over a column 0 of the memory cells, i.e., over the memory cells 101[0,0], . . . , 101[m,0]. The memory cell array 10 further includes n bit line bars BLB[0], . . . , BLB[n](collectively referred to as "bit line bars BLB"). Note that the term "bar" as used in this context indicates a logically inverted signal, for example, the bit line bars BLB[0], . . . , BLB[n] carry a signal logically inverted from a signal carried by the bit lines BL[0], . . . , BL[n]. Each of the bit line bars BLB extends along the second orientation and is over a column of memory cells 101. For example, the bit lines BLB[0] may be over a column 0 of the memory cells, i.e., over the memory cells 101[0,0], . . . m, 101[m,0].

In some embodiments, each of the memory cells 101 is positioned between one of the bit lines BL and one of the bit line bars BLB. For example, in row "m" and column "n" of the memory cells 101 in the memory cell array 10, the memory cell 101[m,n] is positioned between the bit line BL[n] and the bit line bar BLB[n].

Figure 1B:
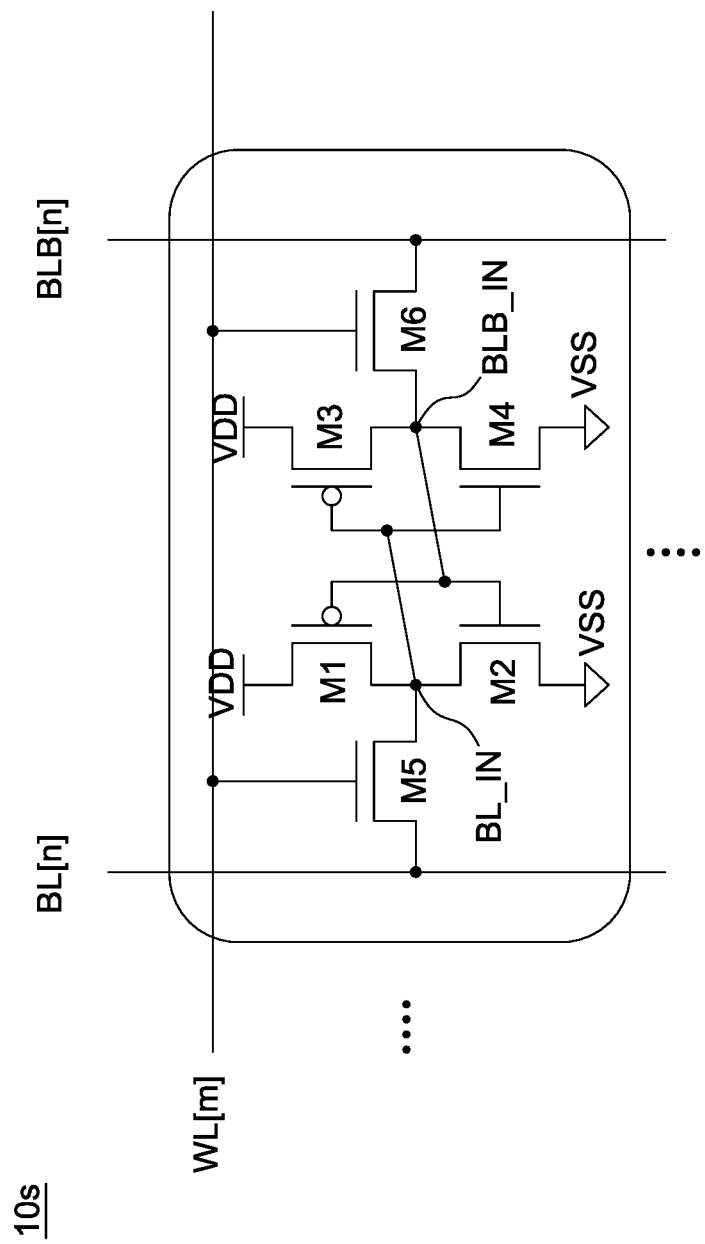
FIG. 1B is a schematic diagram of a memory cell of a memory circuit in accordance with some embodiments of the present disclosure.

FIG. 1B is a schematic diagram of a memory cell 101[m, n] of the memory cell array 10 of the memory circuit 1 in accordance with some embodiments of the present disclosure. The memory cell 101[m,n] as shown in FIG. 1B may be similar to one or more memory cells 101 in the memory cell array 10 of the memory circuit 1. Referring to FIG. 1B, the word line WL[m] as shown in FIG. 1B may be similar to one or more word lines WL in the memory cell array 10 of the memory circuit 1. The bit line BL[n] as shown in FIG. 1B may be similar to one or more bit lines BL in the memory cell array 10 of the memory circuit 1. The bit line bar BLB[n] as shown in FIG. 1B may be similar to one or more bit line bars BLB in the memory cell array 10 of the memory circuit 1.

Referring to FIG. 1B, the memory cell 101[m,n] includes two p-type transistors M1 and M3, and four n-type transistors M2, M4, M5, and M6. The p-type transistors M1 and M3 and the n-type transistors M2 and M4 form a cross-latch or a pair of cross-coupled inverters. For example, the p-type transistor M1 and the n-type transistor M2 can form a first inverter, while the p-type transistor M3 and the n-type transistor M4 can form a second inverter. The memory cell 101[m,n] may be a 6T-cell static random access memory (SRAM). In other embodiments, the memory cells 101 may be any type of SRAM cell.

A source terminal of each of the p-type transistors M1 and M3 is electrically connected to a voltage source VDD. A drain terminal of the p-type transistor M1 is electrically connected to a drain terminal of the n-type transistor M2, a gate terminal of the p-type transistor M3, and a drain terminal of the n-type transistor M5. A drain terminal of the p-type transistor M3 is electrically connected to a drain terminal of the n-type transistor M4, a gate terminal of the p-type transistor M1, and a drain terminal of the n-type transistor M1. A source terminal of each of the n-type transistor M2 and M4 are electrically connected to a supply reference voltage VSS.

A gate terminal of the n-type transistor M4 is electrically connected to the drain terminal of the n-type transistor M2 and the drain terminal of the p-type transistor M1. The gate terminal of the n-type transistor M4 is configured as a storage node BL_IN. A gate terminal of the n-type transistor M2 is electrically connected to the drain terminal of the n-type transistor M4 and the drain terminal of the p-type transistor M3. The gate terminal of the n-type transistor M2 is configured as a storage node BLB_IN.

The word line WL[m] is electrically connected to a gate terminal of each of the n-type transistors M5 and M6. The word line is referred to as a control line because the n-type transistors M5 and M6 are configured to be controlled by a signal on the word line WL[m] in order to transfer data between the bit line BL[n] and the storage node BL_IN and/or between the bit line bars BLB[n] and the storage node BLB_IN.

A source terminal of the n-type transistor M5 is electrically connected to the bit line BL[n]. The bit line BL[n] is configured as both data input and output for the memory cell 101[m,n]. In some embodiments, in a write mode when the n-type transistor M5 is on, applying a logic value to a bit line BL[n] enables writing the logic value to the storage node BL_IN. In a read mode when the n-type transistor M5 is on, a logic value as stored in the storage node BL_IN is read and the logic value of the bit line BL[n] will be changed based on the logic value read from the storage node BL_IN. In a standby mode, the n-type transistor M5 is off, such that the bit line BL[n] is disconnected from the storage node BL_IN. IDC-a2_Sub,AMD A source terminal of the n-type transistor M6 is electrically connected to the bit line BLB[n]. The bit line BLB[n] is configured as both data input and output for the memory cell 101[m,n]. In some embodiments, in a write mode when the n-type transistor M6 is on, applying a logic value to a bit line BLB[n] enables writing the logic value to the storage node BLB_IN. In a read mode when the n-type transistor M6 is on, a logic value as stored in the storage node BLB_IN is read and the logic value of the bit line BLB[n] will be changed based on the logic value read from the storage node BLB_IN. In a standby mode, the n-type transistor M6 is off, such that the bit line BLB[n] is disconnected from the storage node BLB_IN.

Referring again to FIG. 1A, the I/O blocks 11 may each include a multiplexer, a sense amplifier, latch circuit, etc. The numbers of the I/O blocks 11 is proportional to the number of bit lines BL. For example, if the multiplexers of the I/O blocks 11 are 1×4 multiplexers, the numbers of the I/O blocks 11 may be ¼ of the number of bit lines BL. The I/O blocks 11 may include a plurality of data lines DL. Each of the data lines DL may correspond to one or more of the bit lines BL. The I/O blocks 11 may include a plurality of data line bars DLB. Each of the data line bars DLB may correspond to one or more of the bit line bars BLB.

The word line driver 20 includes a plurality of electronic components 20i0, . . . , 20im (collectively referred to as "electronic components 20i" or "first electronic components 20i"), wherein m is an positive integer.

Each of the electronic components 20i has an input terminal IN and an output terminal OUT opposite thereto. The input terminals IN of the inverter of the electronic components 20i are electrically connected to a plurality of word line bars WLB[0], . . . . WLB[m] (collectively referred to as "word line bars WLB"). The word line bars WLB may be electrically connected to a logic circuit of the memory circuit 1. For example, the word line bars WLB may be electrically connected to a row decoder (not shown).

Each of the electronic components 20i includes an inverter. The inverter of each of the electronic components 20i includes a p-type transistor P10, . . . or, P1m (collectively referred to as "p-type transistor P1") and a n-type transistor N10, . . . or, N1m (collectively referred to as "n-type transistor N1").

A source terminal of each of the p-type transistors P1 is electrically connected to a voltage source VDDHD. A source terminal of each of the n-type transistor N1 is electrically connected to a supply reference voltage VSS. A drain terminal of each of the p-type transistors P1 is electrically connected to a drain terminal of the corresponding one of the n-type transistors N1. A gate terminal of the p-type transistor P10 and a gate terminal of n-type transistor N10 are electrically connected to the word line bar WLB[0]. Similarly, a gate terminal of the p-type transistor P1m and a gate terminal of n-type transistor N1m are electrically connected to the word line bar WLB[m].

Each of the gate terminals of the p-type transistor P1 is electrically connected to the corresponding input terminal IN of the electronic components 20i. Each of the gate terminals of the n-type transistor N1 is electrically connected to the corresponding input terminal IN of the electronic components 20i. Each of the drain terminals of the p-type transistor P1 is electrically connected to the corresponding output terminal OUT of the electronic components 20i. Each of the drain terminals of the n-type transistor N1 is electrically connected to the corresponding output terminal OUT of the electronic components 20i.

Each of the input terminals IN of the electronic components 20i may be configured to receive a word line select signal from the corresponding word line bar WLB. The word line select signal may indicate which one of the word lines WL, i.e., word WL[0], . . . , WL[m] is selected. One of the electronic components 20i may be configured to provide a word line enable signal at the output terminal OUT in response to the word line select signal. For example, one of the electronic components 20i may be configured to invert the word line select signal to the word line enable signal. In some embodiments, the word line select signal may be a low voltage (e.g., VSS) and the word line enable signal may be a high voltage (e.g., VDDHD).

Each of the input terminals IN of the electronic components 20i may be configured to receive a word line unselected signal from the corresponding word line bar WLB. The word line unselected signal may indicate which one of the word lines WL, i.e., word WL[0], . . . , WL[m] is not selected. The electronic components 20i may be configured to generate a word line disable signal at the output terminal OUT in response to the word line unselected signal. For example, one of the electronic components 20i may be configured to invert the word line unselected signal to be the word line disable signal. In some embodiments, the word line unselected signal may be a high voltage (e.g., VDDHD) and the word line disable signal may be a low voltage (e.g., VSS).

The word line driver 20 further includes a plurality of electronic components 2010, . . . , 201m (collectively referred to as "electronic components 201" or "second electronic components 201"), wherein m is an positive integer.

Each of the electronic components 201 has a first terminal and a second terminal opposite thereto. The first terminal of each of the electronic components 201 is electrically connected to the output terminal OUT of the corresponding electronic component 20i. For example, the first terminal of the electronic component 2010 can be electrically connected to the output terminal OUT of the electronic component 20i0. The first terminal of the electronic component 201m can be electrically connected to the output terminal OUT of the electronic component 20im.

The first terminal of each of the electronic components 201 may be configured to receive the word line enable signal from the corresponding electronic component 20i. For example, the first terminal of the electronic component 2010 may be configured to receive the word line enable signal from the electronic component 20i0. The first terminal of the electronic component 201m may be configured to receive the word line enable signal from the electronic component 20im. The first terminal of each of the electronic components 201 may be configured to receive the word line disable signal from the corresponding electronic component 20i. For example, the first terminal of the electronic component 2010 may be configured to receive the word line disable signal from the electronic component 2010. The first terminal of the electronic component 201m may be configured to receive the word line disable signal from the electronic component 20im.

The first terminal of the electronic component 2010 is electrically connected to the word line WL[0]. The first terminal of the electronic component 201m is electrically connected to the word line WL[m]. The second terminals of the all of the electronic components 2010 are electrically connected to the conductive line 40.

The conductive line 40 may extend between the word line WL[0] and word line WL[m]. The conductive line 40 may have a length proportional to the number of the word lines WL. The conductive line 40 may have a length proportional to the number of the rows of the memory cell array 10. For example, the length of the conductive line 40 varies based on the design of the rows of a memory cell array (or the word lines). If the number of rows of a memory cell array is larger, the length of the conductive line 40 is longer, and vice versa. For example, the length of the conductive line 40 in a memory circuit with 256 rows is longer than that of the conductive 40 in a memory circuit with 128 rows. The conductive line 40 may extend along an orientation substantially parallel to the arrangement of the columns of the memory cells 101 of the memory cell array 10. The conductive line 40 may extend along an orientation substantially parallel to the bit lines BL/the bit line bars BLB. In some embodiments, the conductive line 40 may be positioned between the word line driver 20 and the memory cell array 10. The conductive line 40 may include a metal wiring. The conductive line 40 may include a contact region for connecting to a via, which in turn may electrically connect to one of the electronic components 201.

The conductive line 40 has a resistance R1 proportional to the number of the word lines WL. The conductive line 40 has a capacitance C1 with respect to the ground, of a value proportional to the number of word lines WL. Furthermore, as the height of the memory cell array 10 increases, the value of the resistance R1 and/or the capacitance of the conductive line 40 increases commensurately.

The electronic components 201 may include switches, which may include p-type transistors P20, . . . , P2m (collectively referred to as "p-type transistors P2"), wherein m is an positive integer. As shown in FIG. 1A, the switch of the electronic component 2010 includes a p-type transistor P20. A source terminal (i.e., the first terminal) of the p-type transistor P20 is electrically connected to the output terminal OUT of the electronic component 20i0 and the word line WL[0]. A drain terminal (i.e., the second terminal) of the p-type transistor P20 is electrically connected to the conductive line 40. A gate terminal of the p-type transistor P20 is electrically connected to the word line bar WLB[0]. The gate terminal of the p-type transistor P20 may be configured to receive a word line select signal or a word line unselected signal from the word line bar WLB[0]. The switch of the electronic component 201m includes a p-type transistor P2m. A source terminal (i.e., the first terminal) of the p-type transistor P2m is electrically connected to the output terminal OUT of the electronic component 20im and the word line WL[m]. A drain terminal (i.e., the second terminal) of the p-type transistor P2m is electrically connected to the conductive line 40. A gate terminal of the p-type transistor P2m is electrically connected to the word line bar WLB[m]. The gate terminal of the p-type transistor P2m may be configured to receive a word line select signal or a word line unselected signal from the word line bar WLB[m].

For example, if the gate terminal of the p-type transistor P2m receives a word line select signal from the word line bar WLB[m], the transistor P2m (e.g., the switch) will turn on and an electrical connection between the conductive line 40 and the word line WL[m] will be established. In other words, in response to the word line select signal, the electronic component 20im provides a word line enable signal on the source terminal (e.g., the first terminal) of the p-type transistor P2m, and the gate terminal turns on the p-type transistor (e.g., the switch) P2m simultaneously. The electronic component 201m may be configured to establish an electrical connection between the word line WL[m] and the conductive line 40 in response to the word line enable signal provided from the first electronic component 20im on the first terminal of the electronic component 201m. When the p-type transistor P2m (e.g., a switch) is turned on, the electronic component 20im is configured to charge a capacitance of the word line WL[m] and the capacitance C1 of the conductive line 40 simultaneously. Therefore, the total capacitances of the conductive line 40 and the word line WL[m] is larger than those of the word line WL[m]. The conductive line 40 introduces an extra charge sharing path to suppress the transition of the word line WL.

Referring again to FIG. 1A, the clamping circuit 30 includes a p-type transistor P31, a n-type transistor N31, and a conductive line 301 (or a second conductive line). A source terminal of the p-type transistor P31 is electrically connected to a voltage source VDD. A drain terminal of the p-type transistor P31 is electrically connected to the conductive line 40 at a node Net_com. The drain terminal of the p-type transistor P31 is electrically connected to a first terminal of the conductive line 301. A gate terminal of the p-type transistor P31 is electrically connected to a drain terminal of the n-type transistor N31. The gate terminal of the p-type transistor P31 is electrically connected to a second terminal of the conductive line 301. A source terminal of the n-type transistor N31 is electrically connected to a supply reference voltage VSS. A gate terminal of the n-type transistor N31 is configured to receive a reset signal RESET.

The clamping circuit 30 may be located at the periphery of the memory circuit 1.

As shown in FIG. 1A, the conductive line 301 may extend between the bit line BL[0] and bit line BL[n]. The conductive line 301 may have a length proportional to the number of the bit lines BL. The conductive line 301 may have a length proportional to the number of the I/O blocks. The conductive line 301 may have a length proportional to the number of the columns of the memory cell array 10. For example, the length of the conductive line 301 varies based on the design of the columns of a memory cell array (or the bit lines). If the number of columns of a memory cell array is larger, the length of the conductive line 301 is longer, and vice versa. For example, the length of the conductive line 301 in a memory circuit with 256 columns is longer than that of the conductive 301 in a memory circuit with 128 columns. The conductive line 301 may extend along an orientation substantially parallel to the arrangement of the columns of the memory cells 101 of the memory cell array 10. The conductive line 301 may extend along an orientation substantially parallel to the word lines WL. The conductive line 301 may include a metal wiring. The conductive line 301 may include a contact region for connecting to a via.

The conductive line 301 has a resistance R2 proportional to the number of the bit lines BL or the/O blocks. The conductive line 301 has a capacitance C2 with respect to the ground, with a value proportional to the number of the bit lines BL or the/O blocks. Furthermore, as width of the memory cell array 10 increases, the value of the resistance R2 and/or the capacitance C2 of the conductive line 301 increases commensurately. IDC-a5_Sub,AMD The resistance R2 of the conductive line 301 may determine the voltage at the node Net_com. For example, the voltage at the node Net_com may equal multiplication of the current pass through the conductive line 301 and the resistance R2 of the conductive line 1l. As length of the conductive line 301 (or resistance R2) increases, voltage at the node Netcom increases commensurately.

At the standby mode of the memory circuit 1, the n-type transistor N31 may receive a reset signal RESET and then the p-type transistor P31 will be turned on. Subsequently, the voltage at the node Net_com will be set as a determined value based on the characteristics of the conductive line 301. Meanwhile, the conductive line 40 is biased at the same voltage as that at the node Net_com.

Figure 1C:
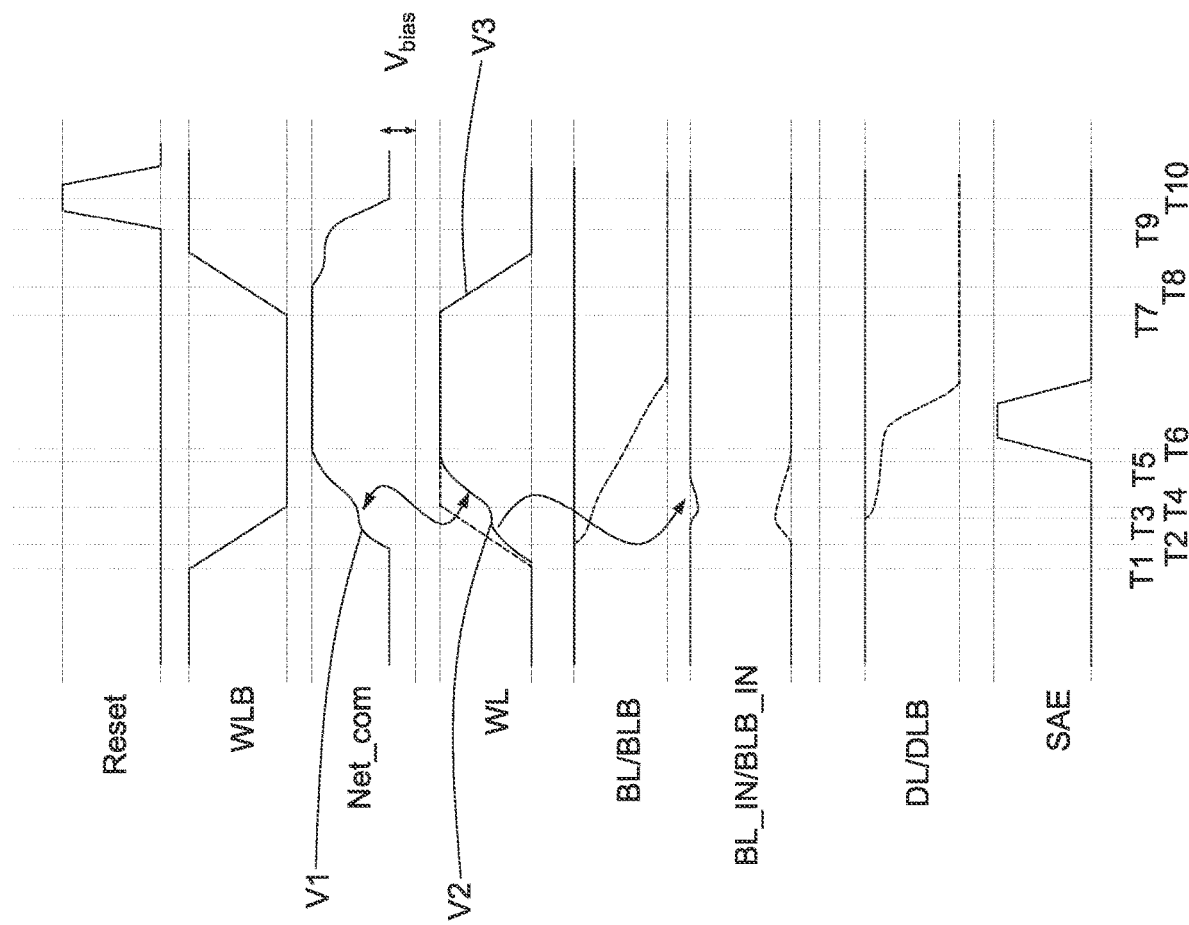
FIG. 1C is a timing diagram that describes a read operation of a memory circuit in accordance with some embodiments of the present disclosure.

FIG. 1C is a timing diagram that describes a read mode of a memory circuit 1 in accordance with some embodiments of the present disclosure.

At time T1, a word line select signal is applied to the word line bar WLB (e.g., the word line bar WLB[m]. That is, the corresponding word line WL (e.g., the word line WL[m]) is selected and then will be enabled by a word line enable signal generated by the electronic component 20i (e.g., the electronic component 20im). From time T1 to time T4, a potential of the word line bars WLB transitions from a high logic value to a low logic value in response to the word line select signal. At time T1, the word line select signal is applied to the gate terminal of the p-type transistor P2 of the electronic component 20i (e.g., the p-type transistor P2m of the electronic component 201m). The p-type transistor P2 will be turned on to establish an electrical connection between the conductive line 40 and the word line WL (e.g., the word line WL[m]). From time T1 to time T6, a potential of the word line WL transitions from a low logic value to a high logic value. From time T2 to time T6, a potential of the node Net_com transitions from a predetermined logic value (e.g., $V_{bias}$) to a high logic value. At time T6, the node Net_com is charged to near full-swing, thus the charge sharing effect of the conductive line 40 is minimized. Thus, the maximum potential (or the maximum level) of the word line WL will not be influenced by the charge sharing effect induced by the conductive line 40.

The word line driver 20 charges the capacitance C1 of the conductive line 40 and the capacitance $C_{WL}$ of the word line WL simultaneously. The conductive line 40 introduces an extra charge sharing path to suppress the transition of the word line WL. Owing to the charge sharing effect of the conductive line 40, the slew rate of the transition of the potential of the word line WL may be suppressed. As shown in FIG. 1C, a curve V2 of the transition of the potential of the word line WL may have a plurality of humps. A curve V1 of the transition of the potential of the node Net_com may have a plurality of humps. The word line's rising slew is suppressed by the charge sharing effect induced by the conductive line 40. For example, a voltage drop $\Delta V_{Net\_com}$, is on the capacitance C1 of the conductive line 40. The selected word line may be suppressed with a voltage $\Delta V_{WL} = (C1/C_{WL})^* \Delta_{Net\_com}$ in the transition from a low logic value to a high logic value.

Furthermore, as previously discussed, capacitance C1 of the conductive line 40 increases with height of the memory cell array 10. Therefore, the charging sharing effect induced by the conductive line 40 is stronger for taller memory cell arrays (or tall instance).

Referring again to FIG. 1C, at time T2, the bit line BL (e.g., the bit line BL[n]) starts to read the memorized bit in the storage node BL_IN (e.g., the storage node BL_IN[n]) and the bit line bar BLB (e.g., the bit line bar BLB[n]) starts to read the memorized bit in the storage node BLB_IN (e.g., the storage node BLB_IN[n]). When the word line WL (e.g., the word line WL[m]) is selected, the n-type transistors M4 and M6 of the memory cell 101[m,n] may form a voltage division level at the storage node BLB_IN. Thus, a read disturb issue may occur on the storage node BLB_IN[m]) in which a lower logic value is stored. If the read disturb exceeds the static noise margin SNM, the memorized bit will be flipped. In the present disclosure, the charge sharing effect of the conductive line 40 suppresses the slew rate of the potential of the transition of the word line WL, the read disturb at the storage node BLB_IN (or the storage node BL_IN) as shown in FIG. 1C can be reduced to an acceptable level.

At time T3, the V/O blocks 11 as illustrated in FIG. 1C start to process the data of the bit lines BL and the bit line bars BLB. For example, the bit line BL transmit a higher logic value, a potential of the data line DL will be retained and a potential of the data line bar DLB will transition from a higher logic value. At time T5, a sense amplifier in the I/O blocks 11 is enabled by a sense amplifier enable signal SAE (e.g., a pulse), the transition of the potential of the data line bar DLB accelerates and the potential of the data line bar DLB becomes a lower logic value.

At time T7, a word line unselected signal is applied to the word line bar WLB and the potential of the word line bar WLB transitions from a lower logic value to a higher logic value. At time T7, a word line unselected signal (e.g., a higher logic value) is applied to the gate terminal of the p-type transistor P2 and the p-type transistor P2 will be turned off. As such, the conductive line 40 and the word line WL are electrically disconnected. At time T7, a potential of the word line WL transitions from a higher logic value to a lower logic value. A curve V3 has substantially the same slope. At time T8, the potential of the node Net_com starts to decline because of the discharge as the capacitance C1 of the conductive line 40.

At time T9, a reset signal RESET (e.g., a pulse) is applied to the n-type transistor N31 of the clamping circuit 30. The n-type transistor N31 and the p-type transistor P31 will be turned on and the charge at the node Net_com will be discharged through the conductive line 301. Subsequently, at time T10, the node Net_com will be biased at the voltage $V_{bias}$. The voltage $V_{bias}$ is determined by the resistance R2 of the conductive line 301. Therefore, as previously discussed, the resistance R2 of the conductive line 301 increases with width of the memory cell array 10 (or wider instance). When the voltage $V_{bias}$ is higher, the charge sharing effect will be weaker. It is beneficial that the damping circuit 30 provides several controllable parameters for optimizing the trade-off between the SNM issue and the performance of the memory circuit 1.

Figure 2A:
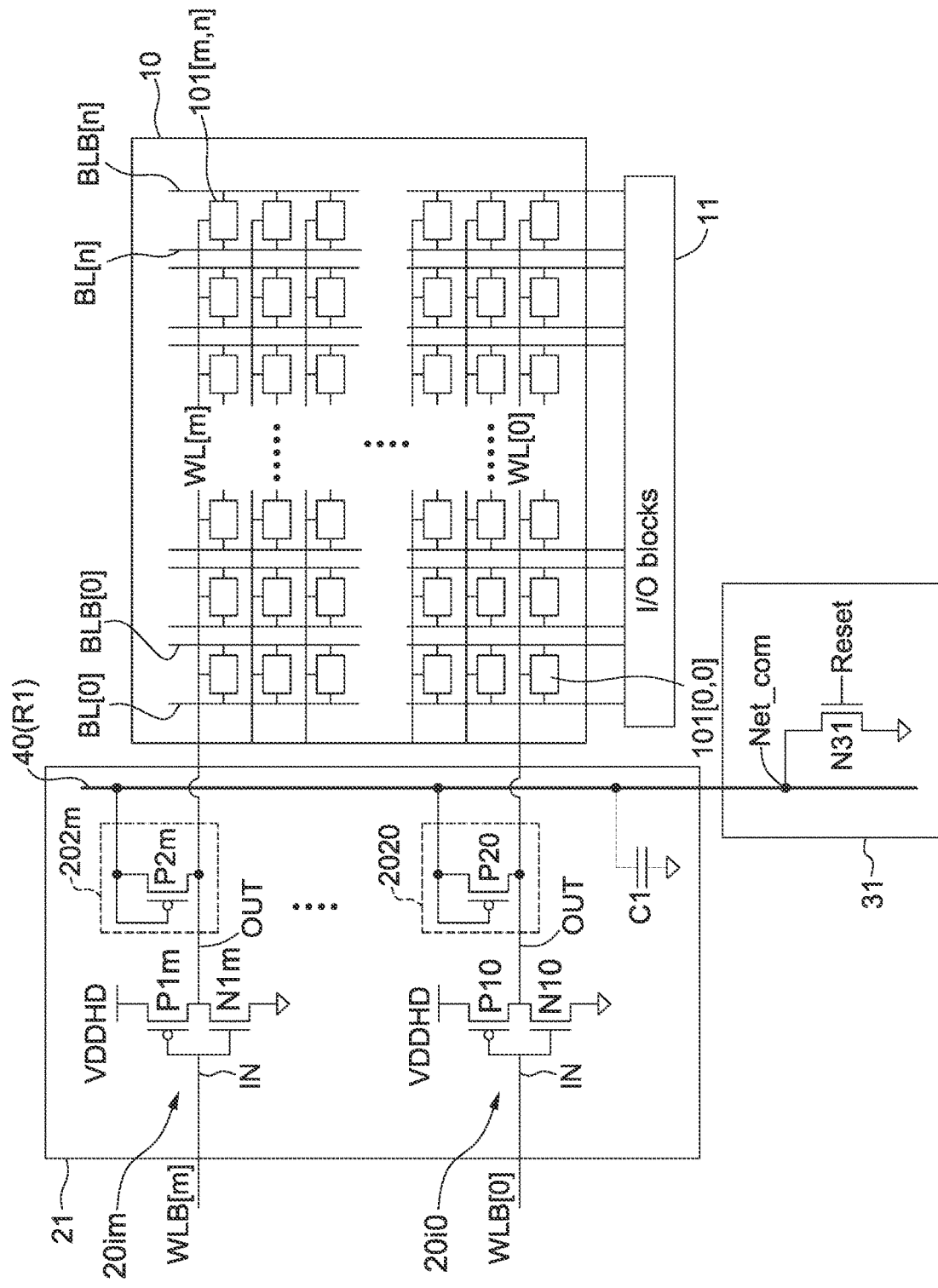
FIG. 2A is a schematic diagram of a memory circuit in accordance with some embodiments of the present disclosure.

FIG. 2A is a schematic diagram of a memory circuit 2 in accordance with some embodiments of the present disclosure. The memory circuit 2 of FIG. 2A is similar to the memory circuit 1 of FIG. 1A, with differences therebetween as follows.

The memory circuit 2 includes the memory cell array 10, the I/O blocks 11, and the conductive line 40 similar to the memory circuit 1. The memory circuit 2 further includes a word line driver 21 and a clamping circuit 31.

The word line driver 21 of the memory circuit 2 includes the electronic component 20i similar to the word line driver 2M of the memory circuit 1. The word line driver 21 further includes a plurality of electronic components 2020, . . . , 202m (collectively referred to as "electronic components 202"), wherein m is a positive integer.

The electronic components 202 include a plurality of p-type transistors P2 similar to the electronic components 201 of the word line driver 20, except that the gate terminal of each of the p-type transistors P2 is shorted to the drain terminal of each of the p-type transistors P2. The p-type transistors P2 are p-type diode-connected transistors. For example, when the first terminal of the electronic component 202 (e.g., the source terminal of the p-type transistor P2m) receives a word line enable signal from the electronic component 20i, the p-type diode-connected transistor P2m will turn on if the potential difference between the first terminal and the second terminal of the electronic component (e.g., the source terminal and the drain terminal of the p-type diode-connected transistor P2m) exceeds a threshold voltage of the p-type diode-connected transistor P2m. As such, an electrical connection is made between the conductive line 40 and the word line WL[m]. The electronic component 20im is configured to charge a capacitance of the word line WL[m] and the capacitance C1 of the conductive line 40 simultaneously. Therefore, the value of the total capacitances of the conductive line 40 and the word line WL[m] exceeds that of the word line WL[m]. The charge sharing effect induced by the conductive line 40 suppresses the slew rate of the potential of the transition on the word line WL[m].

The p-type diode connected transistors P2 only work at relatively high operating voltage. The p-type diode connected transistors P2 will not impact the read margin or slew rate of the transition of the word line WL at relatively low operating voltage but mitigate the read disturbance at relatively high operating voltage.

The clamping circuit 31 includes an n-type transistor N31 similar to the clamping circuit 30 of the memory circuit 1 of FIG. 1A, except that the drain terminal of the n-type transistor N31 is directly connected to the conductive line 40 at the node Net_com, without the conductive line 301 of the clamping circuit 30. At the standby mode of the memory circuit 2, the gate terminal of the n-type transistor N31 receives a reset signal RESET and the potential of the node Net_com will be pulled down to the supply reference voltage VSS or the ground. Subsequently, the potential of the conductive line 40 will be VSS or the ground, instead of the voltage $V_{bias}$ as clamped by the clamping circuit 30.

Figure 2B:
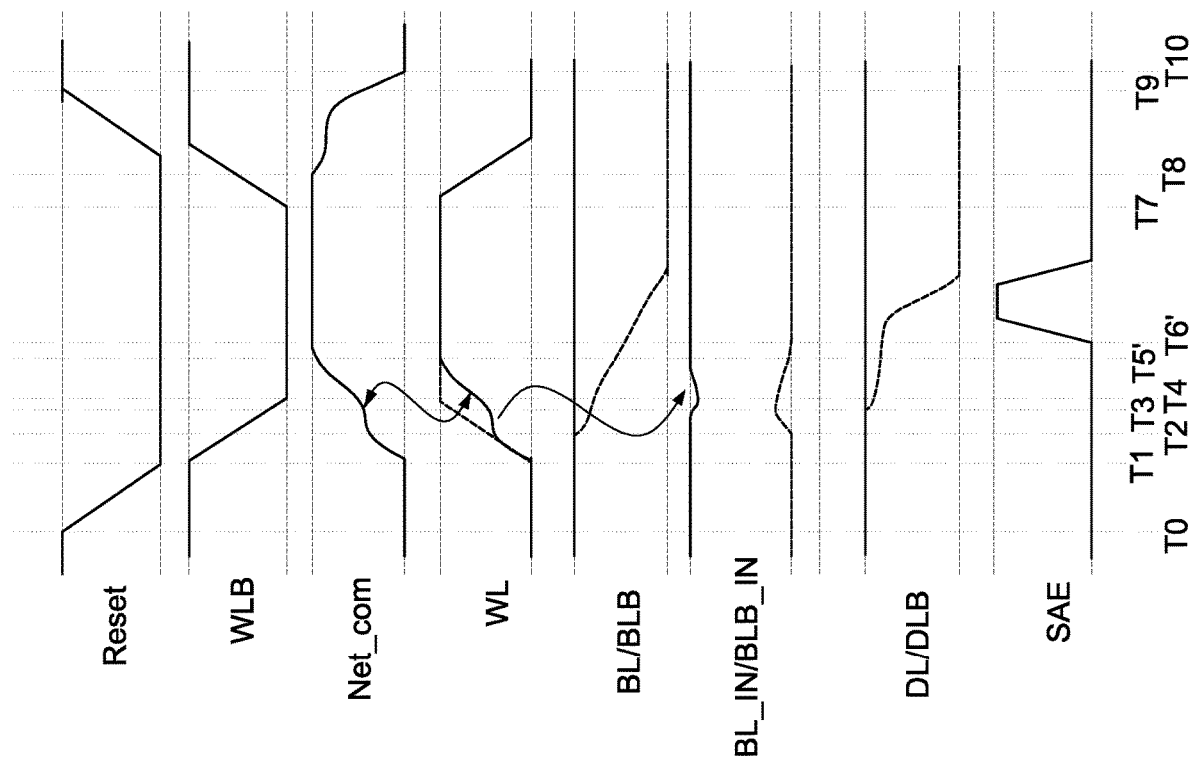
FIG. 2B is a timing diagram that describes a read operation of a memory circuit in accordance with some embodiments of the present disclosure.

FIG. 2B is a timing diagram that describes a read operation of a memory circuit in accordance with some embodiments of the present disclosure in which the transition of the potentials on the word line bar WLB, the node Net_com, the word line, the bit line BL, the bit line bar BLB, the storage nodes BL_IN and BLB_IN, the data line DL and the data line bar DLB, and the sense amplifier enable signal SAE are the same as those as illustrated in FIG. 1C, with differences therebetween as follows.

From time T0 to time T1, the reset signal RESET transitions from a higher logic value to a lower logic value to turn-off the n-type transistor N31 of the clamping circuit 31 to make Net_com floating. At time T1, the electronic component 20i starts to charge the conductive line 40 and the word line WL simultaneously. Since the conductive line 40 is clamped with the supply reference voltage VSS or the ground at standby mode, the effective capacitance of the conductive line 40 will be higher. Therefore, the slew rate of the word line WL of the memory circuit 2 may be lower than that of the memory circuit 1. From time T1 to time T5, a potential of the word line WL transitions from a lower logic value to a higher logic value. At time T6', a sense amplifier in the I/O blocks 11 is enabled by a sense amplifier enable signal SAE (e.g., a pulse), the transition of the potential of the data line bar DLB accelerates and the potential of the data line bar DLB becomes a lower logic value.

At time T5', the node Net_com is charged to near full-swing, thus the charge sharing effect of the conductive line 40 is minimized and the maximum potential (or maximum level) of the word line WL will not be influenced by the charge sharing effect induced by the conductive line 40.

At time T9, a reset signal RESET transitions to a higher logic value and is applied to the n-type transistor N31 of the clamping circuit 30. The n-type transistor N31 will be turned on and the charge at the node Net_com will be discharged via the n-type transistor N31. Subsequently, at time T10, the node Net_com will be biased at the supply reference voltage VSS or the ground.

Figure 3A:
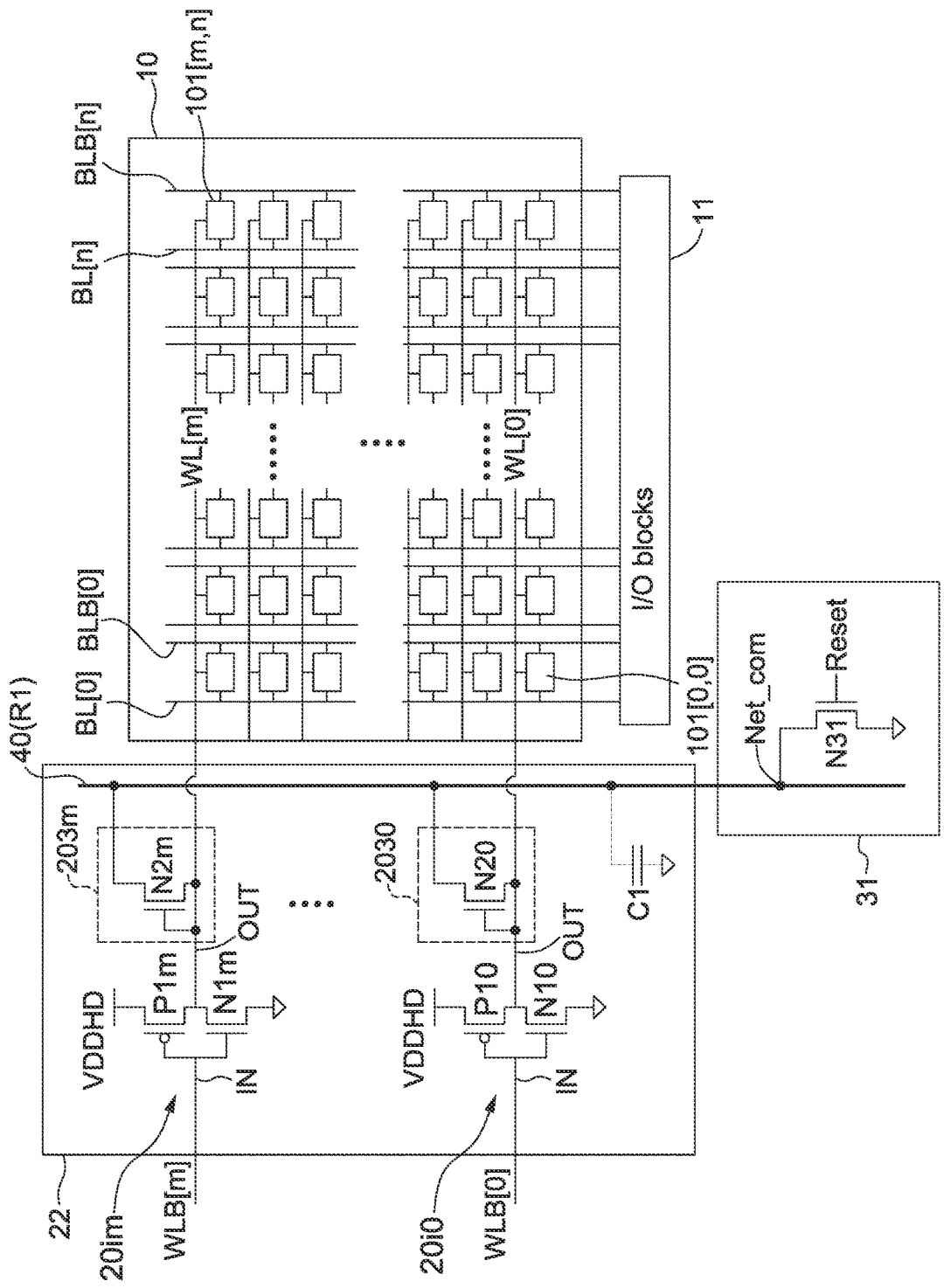
FIG. 3A is a schematic diagram of a memory circuit in accordance with some embodiments of the present disclosure.

FIG. 3A is a schematic diagram of a memory circuit 3 in accordance with some embodiments of the present disclosure, similar to the memory circuit 2 of FIG. 2A, with differences therebetween as follows.

The memory circuit 3 includes memory cell array 10, I/O blocks 11, and conductive line 40 similar to the memory circuit 1. The memory circuit 2 further includes a word line driver 22 and a clamping circuit 31.

The word line driver 22 of the memory circuit 3 includes electronic component 20i similar to the word line driver 21 of the memory circuit 2. The word line driver 22 further includes a plurality of electronic components 2030, .... 203m (collectively referred to as "electronic components 203"), wherein m is a positive integer.

Each of the electronic components 203 has a first terminal and a second terminal opposite thereto The first terminal of each of the electronic components 203 is electrically connected to the output terminal OUT of the corresponding electronic component 20i. For example, the first terminal of the electronic component 2030 can be electrically connected to the output terminal OUT of the electronic component 2010. The first terminal of the electronic component 203m can be electrically connected to the output terminal OUT of the electronic component 20im.

The first terminal of each of the electronic components 203 may be configured to receive the word line enable signal from the corresponding electronic component 20i. The first terminal of each of the electronic components 201 may be configured to receive the word line disable signal from the corresponding electronic component 20i.

The first terminal of the electronic component 2030 is electrically connected to the word line WL[0]. The first terminal of the electronic component 203m is electrically connected to the word line WL[m]. The second terminals of the all of the electronic components 2010 are electrically connected to the conductive line 40.

The electronic components 203 may include switches, which may include n-type transistors N20, .... N2m (collectively referred to as "n-type transistors N2"), wherein m is an positive integer. As shown in FIG. 3A, the switch of each of the electronic components 203 includes a n-type transistor N2. A drain terminal (i.e., the first terminal) of each of the n-type transistors N2 is electrically connected to the output terminal OUT of the corresponding electronic component 20i and the corresponding word line WL. A source terminal (i.e., the second terminal) of each of the n-type transistors N2 is electrically connected to the conductive line 40. A gate terminal of each of the n-type transistors N2 is electrically connected to the output terminal OUT of the corresponding electronic component 20i and the corresponding word line WL. The gate terminal of each of the n-type transistors N2 may be configured to receive a word line enable signal or a word line disable signal from the corresponding electronic component 20i. The n-type transistors N2 may be n-type diode-connected transistors.

For example, if the gate terminal of the n-type transistor N2m receives a word line enable signal, the transistor N2m (e.g., a switch) will turn on and an electrical connection between the conductive line 40 and the word line WL[m] will be established. When the n-type transistor N2m (e.g., a switch) is turned on, the electronic component 20im is configured to charge a capacitance of the word line WL[m] and the capacitance C1 of the conductive line 40 simultaneously. Therefore, the value of the total capacitances of the conductive line 40 and the word line WL[m]exceeds that of the word line WL[m]. The charge sharing effect induced by the conductive line 40 suppresses the slew rate of the potential of the transition on the word line WL[m].

The n-type diode connected transistors N2 only work at relatively high operating voltages. The n-type diode connected transistors N2 will not impact the read margin or slew rate of the transition of the word line WL at relatively low operating voltages but mitigate the read disturb at relatively high operating voltages.

Figure 3B:
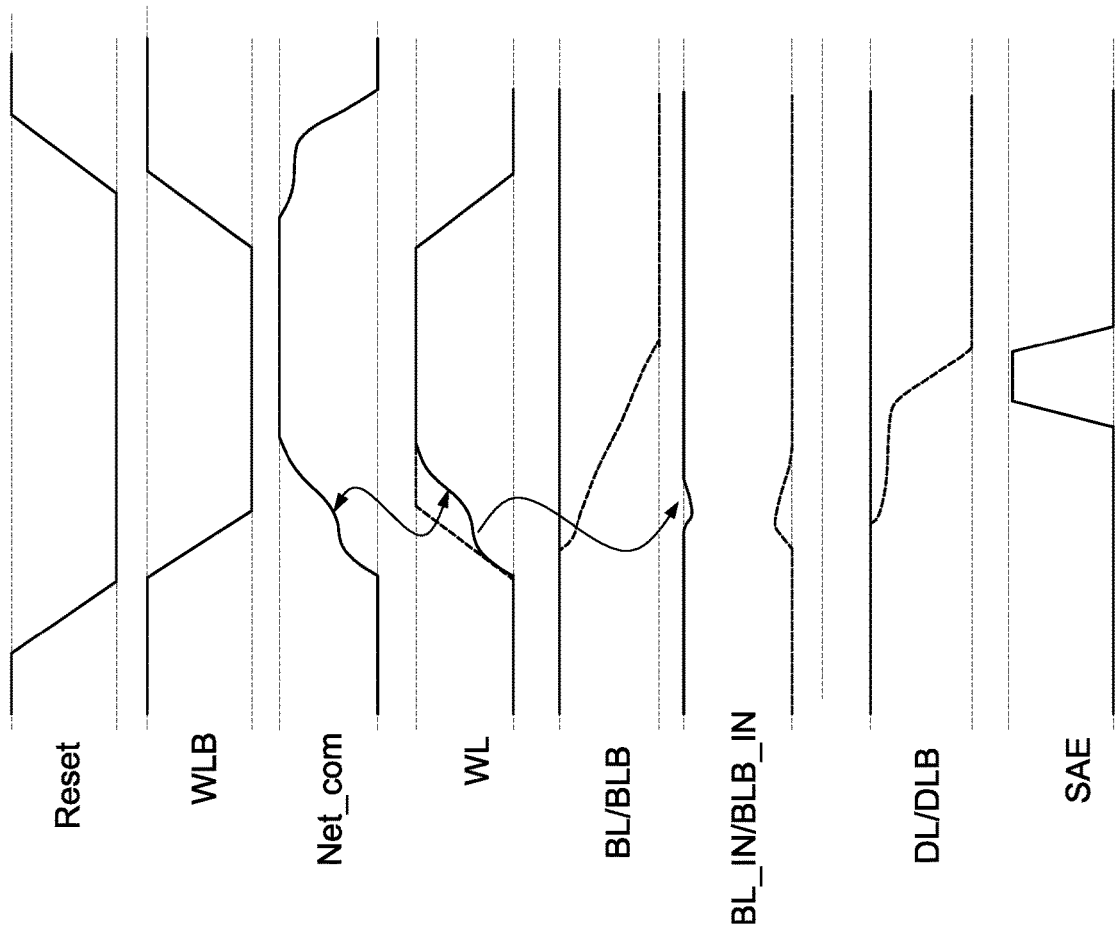
FIG. 3B is a timing diagram that describes a read operation of a memory circuit in accordance with some embodiments of the present disclosure.

FIG. 3B is a timing diagram that describes a read operation of a memory circuit in accordance with some embodiments of the present disclosure, in which the transition of the potentials on the reset signal RESET, the word line bar WLB, the node Net_com, the word line, the bit line BL, the bit line bar BLB, the storage nodes BL_IN and BLB_IN, the data line DL and the data line bar DLB, and the sense amplifier enable signal SAE are the same as those as illustrated in FIG. 2B, with differences therebetween as follows.

The n-type transistor N2 may intrinsically have a higher carrier mobility than that of the p-type transistor P2. The transition of the potential of the node Net_com in FIG. 3B may be earlier than that of FIG. 2B.

Figure 4A:
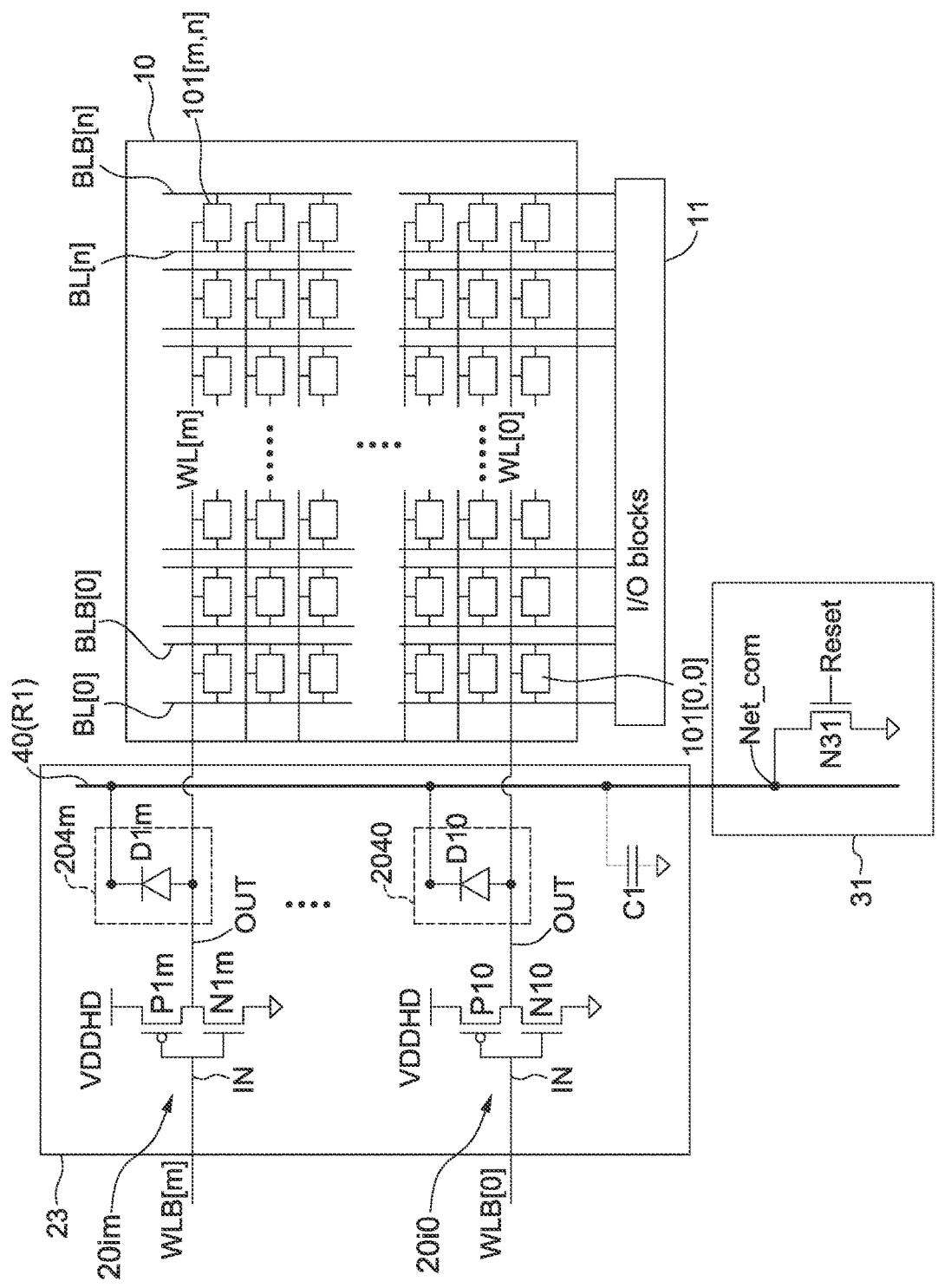
FIG. 4A is a schematic diagram of a memory circuit in accordance with some embodiments of the present disclosure.

FIG. 4A is a schematic diagram of a memory circuit 4 in accordance with some embodiments of the present disclosure. The memory circuit 4 of FIG. 4A is similar to the memory circuit 2 of FIG. 2A, with differences therebetween as follows.

The memory circuit 4 includes memory cell array 10. I/O blocks 11, clamping circuit 31, and conductive line 40 similar to the memory circuit 2. The memory circuit 4 further includes a word line driver 23.

The word line driver 23 of the memory circuit 4 includes electronic components 20i similar to the word line driver 21 of the memory circuit 2. The word line driver 23 further includes a plurality of electronic components 2040 ...., 204m (collectively referred to as "electronic components 204"), wherein m is a positive integer.

The electronic components 204 may include switches, which may include diodes D10, ..., D1m (collectively referred to as "diodes D1"), wherein m is an positive integer. An anode of each of the diodes D1 is electrically connected to the output terminal OUT of the corresponding electronic component 20*i* and the corresponding word line WL. A cathode of each of the diodes D1 is electrically connected to the conductive line 40.

For example, when the anode of the diode D1*m* receives a word line enable signal from the electronic component 20*im*, the diode D1*m* will turn on if a voltage drop on the diode Dim exceeds a threshold voltage thereof. As such, an electrical connection is made between the conductive line 40 and the word line WL[m]. The electronic component 20*im* is configured to charge a capacitance of the word line WL[m] and the capacitance C1 of the conductive line 40 simultaneously. Therefore, the value of the total capacitances of the conductive line 40 and the word line WL[m] exceeds that of the word line WL[m]. The charge sharing effect induced by the conductive line 40 suppresses the slew rate of the potential of the transition on the word line WL[m].

The diodes D1 only work at relatively high operating voltages. The diodes D1 will not impact read margin or slew rate of the transition of the word line WL at relatively low operating voltages but mitigate the read disturbance at relatively high operating voltages.

Figure 4B:
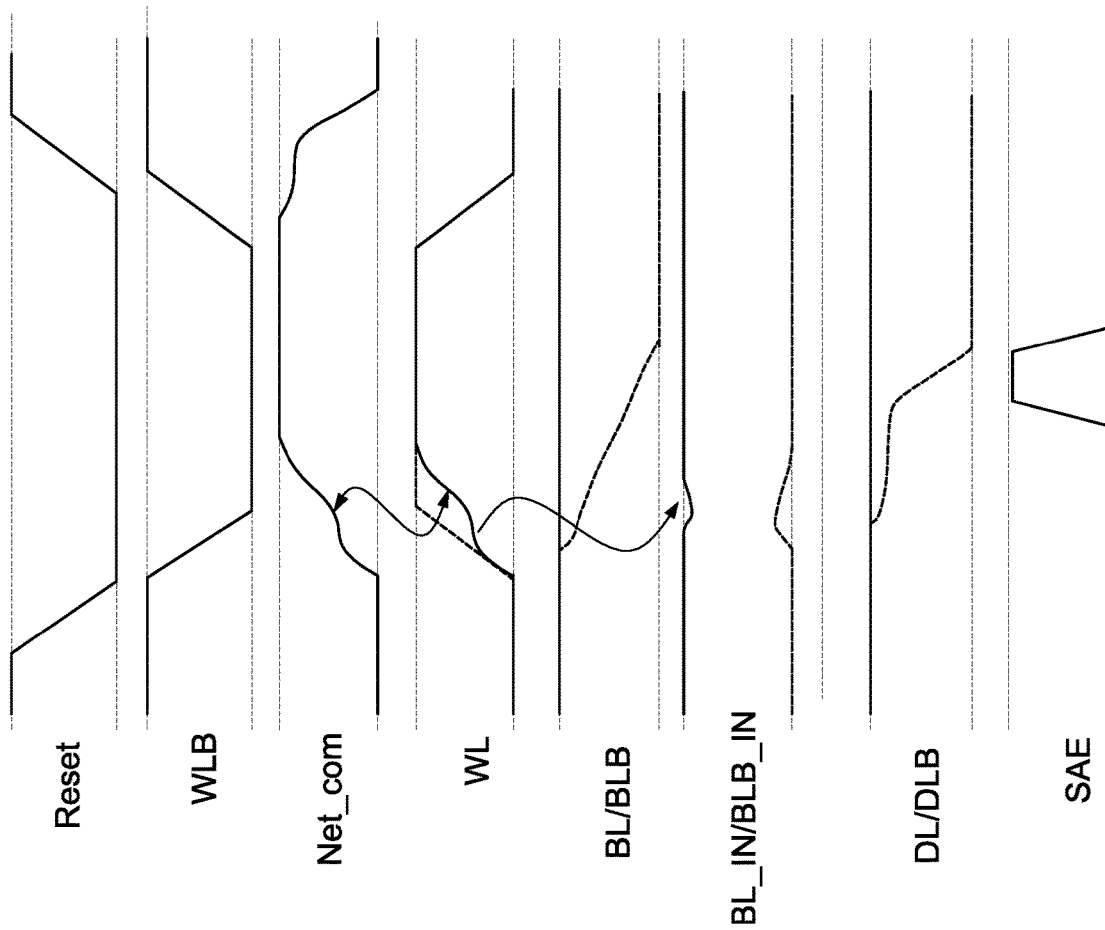
FIG. 4B is a timing diagram that describes a read operation of a memory circuit in accordance with some embodiments of the present disclosure.

FIG. 4B is a timing diagram that describes a read operation of a memory circuit in accordance with some embodiments of the present disclosure, in which transition of the potentials on the reset signal RESET, the word line bar WLB, the node Net_com, the word line, the bit line BL, the bit line bar BLB, the storage nodes BL_IN and BLB_IN, the data line DL and the data line bar DLB, and the sense amplifier enable signal SAE are the same as those as illustrated in FIG. 2B, with differences therebetween as follows.

The p-type diode-connected transistor N2 may have a higher switching speed than that of the diode D1. The transition of the potential of the node Net_com in FIG. 4B may be later than that of FIG. 2B.

Figure 5A:
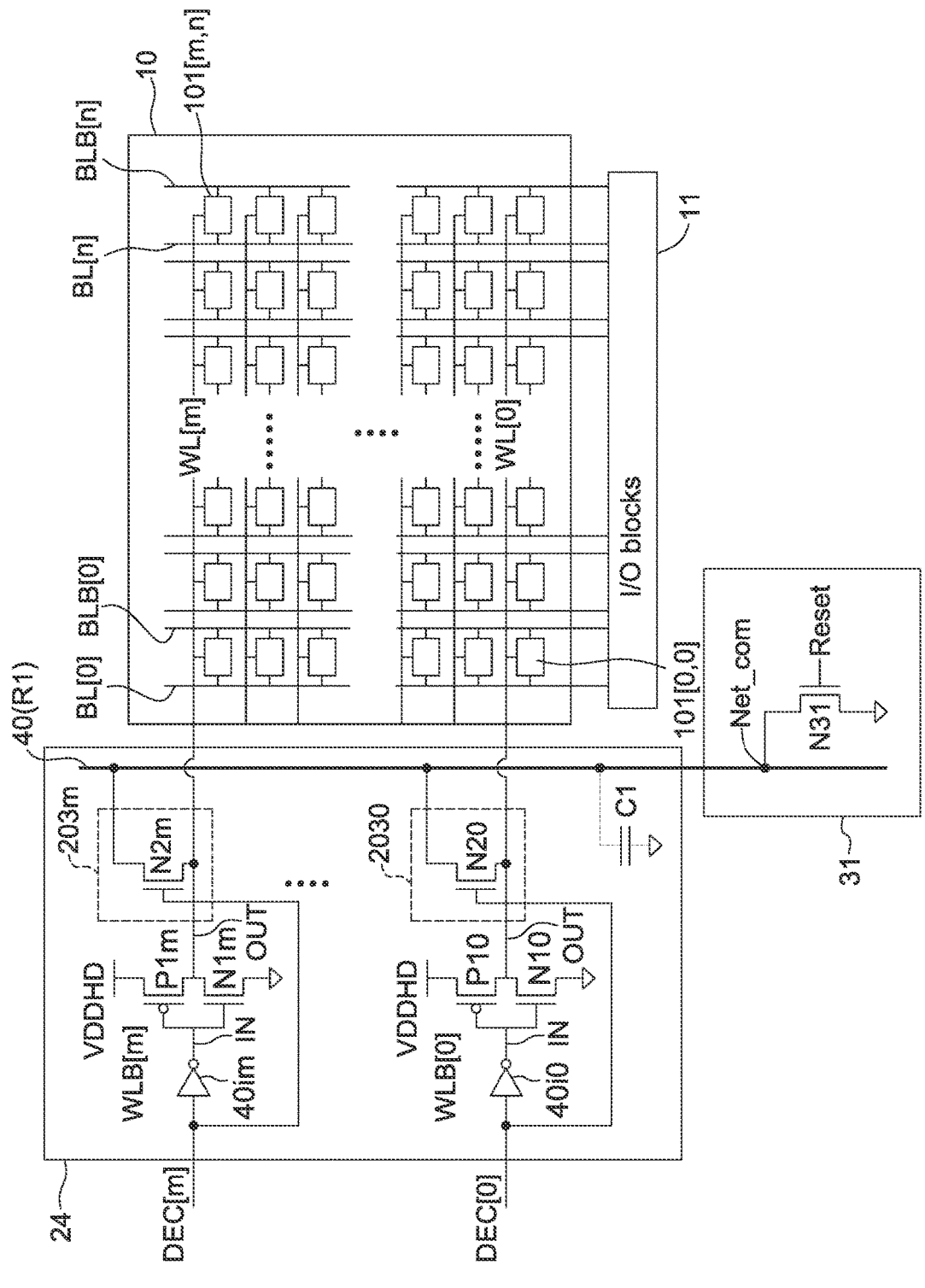
FIG. 5A is a schematic diagram of a memory circuit in accordance with some embodiments of the present disclosure.

FIG. 5A is a schematic diagram of a memory circuit 5 in accordance with some embodiments of the present disclosure. The memory circuit 5 of FIG. 5A is similar to the memory circuit 3 of FIG. 3A, with differences therebetween as follows.

The memory circuit 5 includes memory cell array 10. I/O blocks 11, clamping circuit 31, and conductive line 40 similar to memory circuit 3. The memory circuit 5 further includes a word line driver 24.

The word line driver 24 of the memory circuit 5 includes electronic components 20*i* and electronic components 203 similar to the word line driver 22 of the memory circuit 3. Word line driver 24 further includes a plurality of inverters 40*i*0, . . . , 40*im* (collectively referred to as "inverters 40*i*"), wherein m is a positive integer.

Each of the inverters 40*i* has a first terminal and a second terminal. The first terminals of the inverters 40*i* are electrically connected to decoder line DEC[0], . . . , DEC[0] (collectively referred to as "decoder lines DEC"), wherein m is a positive integer. The second terminals of the inverters 40*i* are electrically connected to the word line bars WLB. For example, the gate terminal of each of the n-type transistors N2 can be electrically connected to the corresponding decoder line DEC. For example, when the gate terminal of each of the n-type transistors N2*m* receives a decoder signal from the decoder line DEC[m], the n-type transistor N2*m* will turn on, and an electrical connection will be made between the conductive line 40 and the word line WL[m]. The electronic component 20*im* is configured to charge a capacitance of the word line WL[m] and the capacitance C1 of the conductive line 40 simultaneously. Therefore, the value of the total capacitances of the conductive line 40 and the word line WL[m] is larger than that of the word line WL[m]. The charge sharing effect induced by the conductive line 40 suppresses the slew rate of the potential of the transition on the word line WL[m].

Figure 5B:
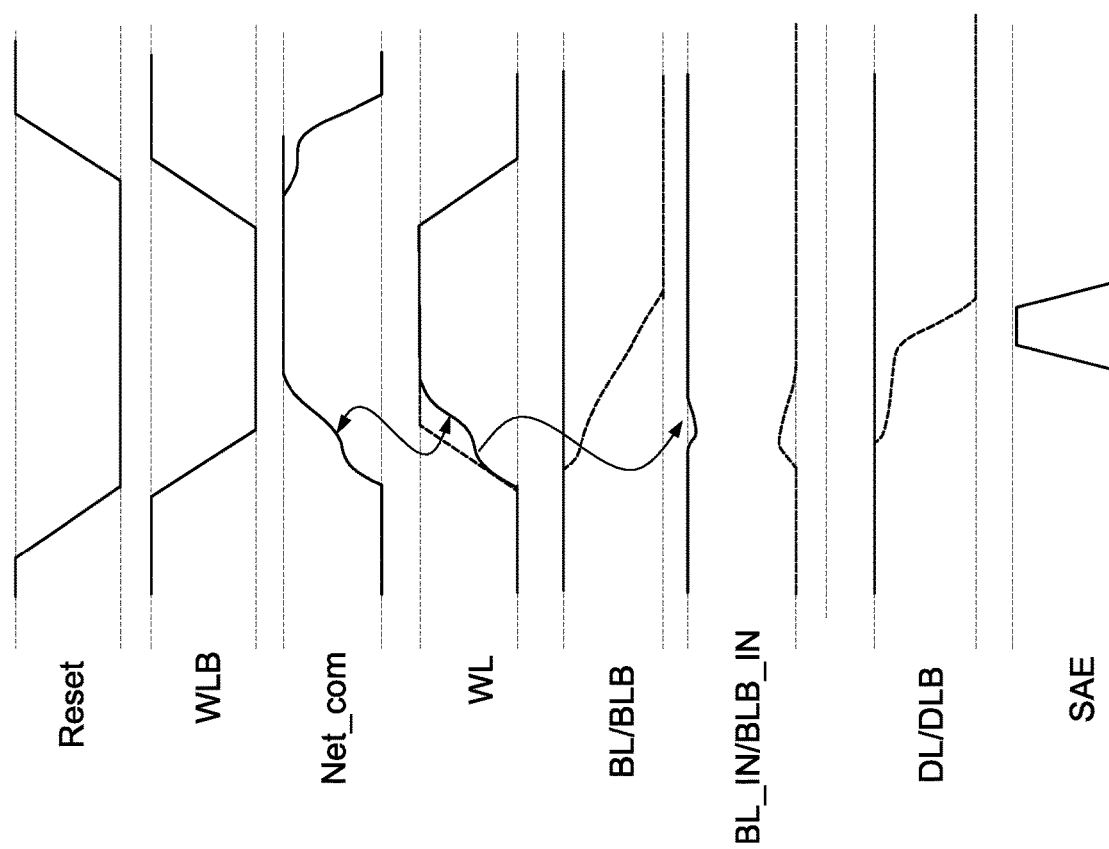
FIG. 5B is a timing diagram that describes a read operation of a memory circuit in accordance with some embodiments of the present disclosure.

FIG. 5B is a timing diagram that describes a read operation of a memory circuit in accordance with some embodiments of the present disclosure, in which transition of the potentials on the reset signal RESET, the word line bar WLB, the node Net_com, the word line, the bit line BL, the bit line bar BLB, the storage nodes BL_IN and BLB_IN, the data line DL and the data line bar DLB, and the sense amplifier enable signal SAE are the same as those as illustrated in FIG. 2B, with differences therebetween as follows.

The n-type transistor N2 of FIG. 5A may be turned on earlier than the n-type diode connected transistor N2 of FIG. 3A. The transition of the potential of the node Net_com in FIG. 5B may be earlier than that of FIG. 3B.

Figure 6A:
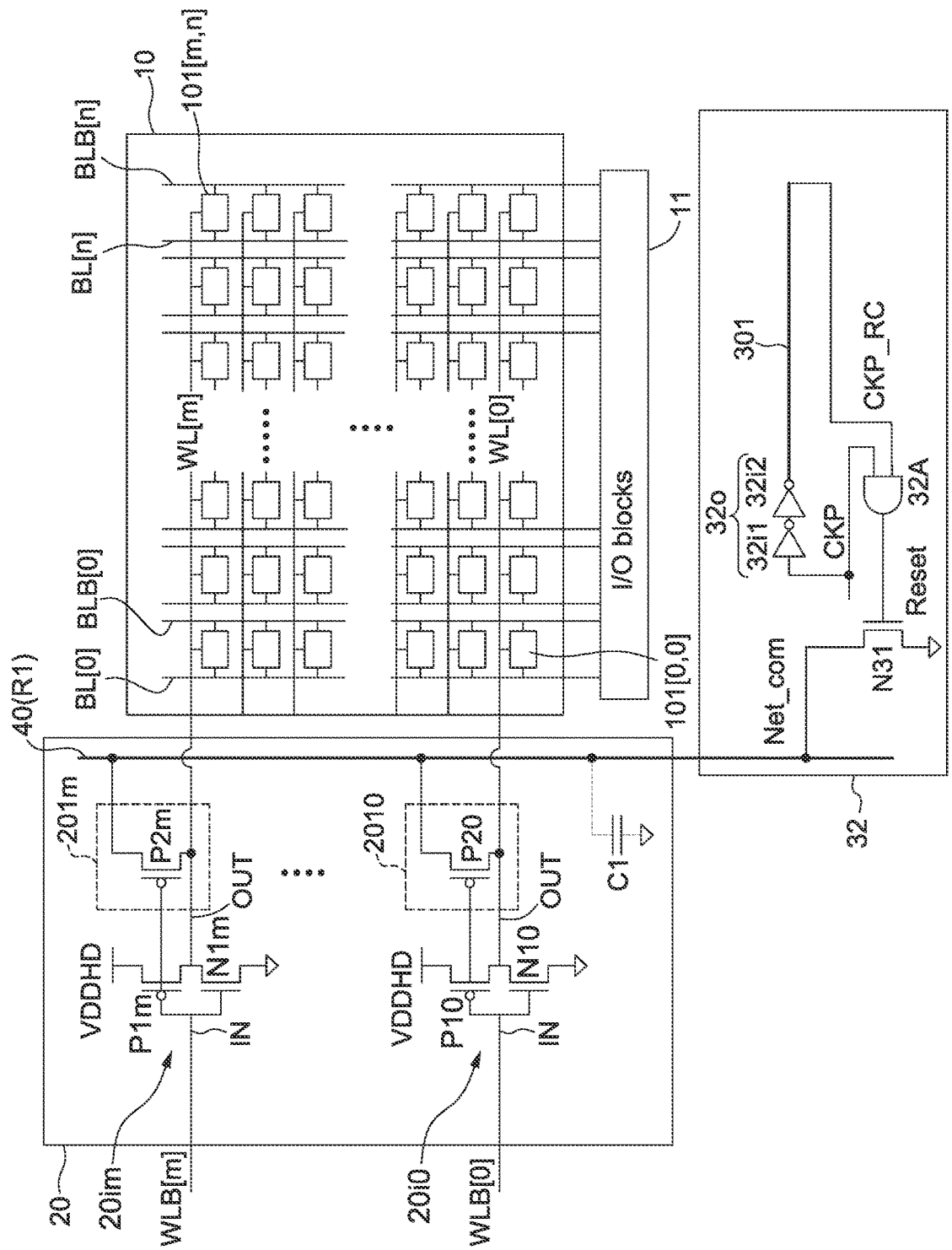
FIG. 6A is a schematic diagram of a memory circuit in accordance with some embodiments of the present disclosure.

FIG. 6A is a schematic diagram of a memory circuit 6 in accordance with some embodiments of the present disclosure. The memory circuit 6 of FIG. 6A is similar to the memory circuit 1 of FIG. 1A, with differences therebetween as follows.

The memory circuit 6 includes memory cell array 10, I/O blocks 11, word line driver 20, and conductive line 40 similar to memory circuit 1. The memory circuit 6 further includes a clamping circuit 32.

The clamping circuit 32 includes the n-type transistor N31 and the conductive line 301 (or a third conductive line) similar to the clamping circuit 30 of the memory circuit 1 of FIG. 1A, except that the drain terminal of the n-type transistor N31 is directly connected to the conductive line 40 at the node Net_com. The clamping circuit 32 further includes a delay chain 32*o* and a logic circuit 32A. The delay chain 32*o* includes plurality of inverters 32*i*1 and 32*i*2. The inverter 3211 has an output terminal electrically connected to an input terminal of the inverter 32*i*2. The delay chain 32*o* has a first terminal configured to receive a clock signal CKP and a second terminal connected to first terminal of the conductive line 301. The logic circuit 32A has a first input terminal configured to receive the clock signal CKP, a second input terminal connected to a second terminal of the conductive line 301 and receive another clock signal CKP_RC, and an output terminal electrically connected to the gate terminal of the n-type transistor N31. The logic circuit 32A may include an adder. The adder of the logic circuit 32A may be configured to generate a reset signal RESET based on the clock signals CKP and CKP_RC.

The RC delay induced by the conductive line 301 may determine the voltage at the node Net_com. For example, if the conductive line 301 is longer because of a wider instance memory cell array 10, the RC delay will be increased.

Figure 6B:
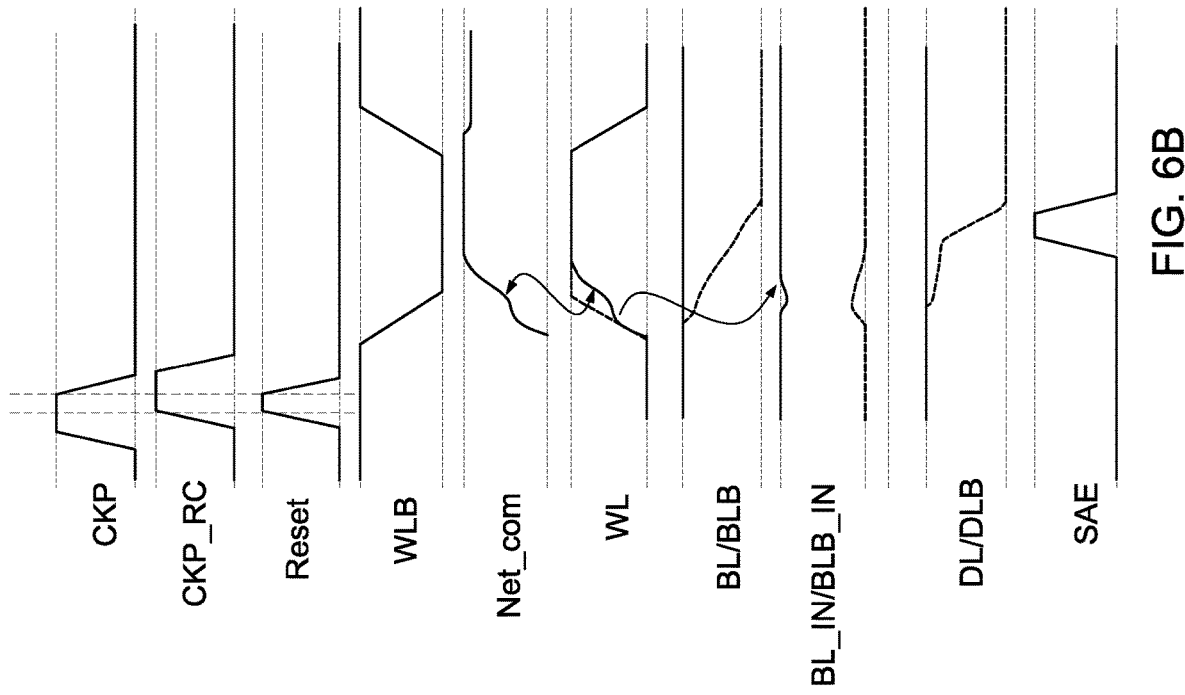
FIG. 6B is a timing diagram that describes a read operation of a memory circuit in accordance with some embodiments of the present disclosure.

FIG. 6B is a timing diagram that describes a read operation of a memory circuit 6 in accordance with some embodiments of the present disclosure, in which memory circuit 6 may have a narrow instance, that is, the number of bit lines BL is less than that of the word lines WL. The transition of the potentials on the word line bar WLB, the node Net_com, the word line, the bit line BL, the bit line bar BLB, the storage nodes BL_IN and BLB_IN, the data line DL and the data line bar DLB, and the sense amplifier enable signal SAE are the same as those as illustrated in FIG. 1B, with differences therebetween as follows.

Since the RC delay of the shorter conductive line 302 is relatively small, the clock signals CKP and CKP_RC overlap in a period P1 and thus the logic circuit 32A generates a reset signal RESET to the gate terminal of the n-type transistor N31. Subsequently, the n-type transistor N31 will turn on and pull down the potential of the conductive line 40 (e.g., the node Net_com) to the supply reference voltage VSS and the ground. Therefore, at the read mode, the word line driver 20 is electrically connected to the conductive line 40 and the selected word line WL. The electronic component 20$i$ of the word line driver 20 is configured to charge the capacitance C1 of the conductive line 40 and the capacitance $C_{WL}$ of the selected word line WL. The charge sharing effect induced by the conductive line 40 suppresses the slew rate of the potential of the transition on the word line WL.

Figure 6C:
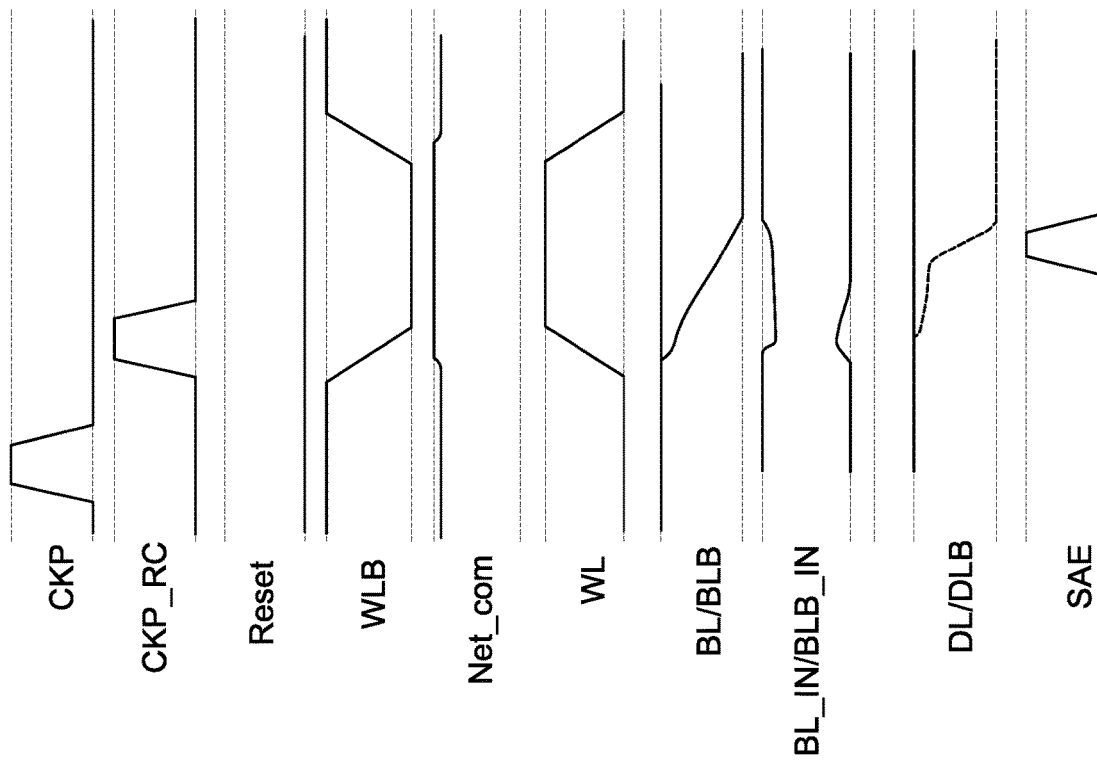
FIG. 6C is a timing diagram that describes a read operation of a memory circuit in accordance with some embodiments of the present disclosure.

FIG. 6C is a timing diagram that describes a read operation of a memory circuit in accordance with some embodiments of the present disclosure, in which, memory circuit 6 may be wider, that is, the number of bit lines BL exceeds that of the word lines WL. Since the RC delay of the longer conductive line 302 is relatively large, the clock signals CKP and CKP_RC do not overlap in the time frame and thus the logic circuit 32A will not generate a reset signal to the gate terminal of the n-type transistor N31. Subsequently, the n-type transistor N31 remains off and the potential of the conductive line 40 (e.g., the node Net_com) is floating or stays at a relatively high logic value (e.g., close to the voltage supply VDD). Therefore, the effective capacitance C1 of the conductive line 40 will be relatively low. Even though the word line driver 20 is electrically connected to the conductive line 40 and the selected word line WL, the charge sharing effect induced by the conductive line 40 will be relatively weak. Subsequently, the potential of the transition of the word line WL will transition with a substantially steady slew rate.

In some embodiments, a memory circuit may include the memory cell array 10, the I/O blocks 11, one of the word line drivers 20, 21, 22, 23, and 24, one of the clamping circuits 30, 31, and 32, a conductive line 40.

The present disclosure provides a memory circuit. The memory circuit includes: a plurality of word lines, a word line driver, and a first conductive line. The word line driver is electrically connected to the word lines. The word line driver includes: a plurality of first electronic components and a plurality of second electronic components. The plurality of first electronic components each electrically connected to the corresponding word line. The plurality of second electronic components each having a first terminal and a second terminal. The first terminal is electrically connected to the corresponding word line and the corresponding first electronic component. The first conductive line is electrically connected to the second terminal of the second electronic components. The first conductive line has a length proportional to the number of the word lines.

The present disclosure provides a word line driver. The word line driver includes first electronic component and a second electronic component. The second electronic component has a first terminal electrically connected to the first electronic component and a second terminal electrically connected to a conductive line. The second electronic component is configured to establish an electrical connection between a word line and the conductive line in response to a word line enable signal provided from the first electronic component on the first terminal of the second electronic component.

The present disclosure provides a memory circuit. The memory circuit includes: a plurality of bit lines, a plurality of word lines, a first conductive line, and a second conductive line. The first conductive line is electrically connected to the word lines. The first conductive line has a first length proportional to the numbers of the word lines. The second conductive line has a second length proportional to the number of the bit lines.

The methods and features of the present disclosure have been sufficiently described by examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the present disclosure.

What is claimed is:

1. A memory circuit, comprising:
   a plurality of word lines;
   a word line driver electrically connected to the word lines, the word line driver comprising:
      a plurality of first electronic components; and
      a plurality of second electronic components each having a first terminal and a second terminal, wherein the first terminal of each of the second electronic components is electrically connected to a respective first electronic component of the plurality of first electronic components, and to a respective word line of the plurality of word lines;
   a first conductive line electrically connected to the second terminal of each of the second electronic components, wherein the first conductive line has a length proportional to the number of the word lines; and
   a clamping circuit electrically connected to the first conductive line at a node, wherein the clamping circuit comprises a second conductive line and a first transistor having a drain terminal electrically connected to a first terminal of the second conductive line, a source terminal electrically connected to a voltage supply, and a gate terminal electrically connected to a second terminal of the second conductive line.

2. The memory circuit of claim 1, wherein each of the first electronic components includes an inverter having an input terminal configured to receive a word line select signal and an output terminal configured to provide a word line enable signal in response to the word line select signal, wherein the output terminal of each of the first electronic components is electrically connected to the first terminal of a respective second electronic component of the second electronic components and a respective word line of the plurality of word lines.

3. The memory circuit of claim 2, wherein each of the second electronic components includes a switch, and wherein, when the switch is turned on, an electrical connection between the first conductive line and one word line of the plurality of word lines is established.

4. The memory circuit of claim 1, wherein a curve of a transition of a potential of the one word line of the plurality of word lines has a plurality of humps.

5. The memory circuit of claim 4, wherein a curve of a transition of a potential on the first conductive line has a plurality of humps.

6. The memory circuit of claim 1, wherein the clamping circuit is configured to clamp the first conductive line at a predetermined bias at a standby mode of the memory circuit.

7. The memory circuit of claim 6, wherein the clamping circuit comprises a second transistor having a drain terminal electrically connected to the first conductive line, a source terminal electrically connected to ground, and a gate terminal configured to receive a reset signal.

8. The memory circuit of claim 7, wherein the second terminal of the second conductive line is electrically connected to the drain terminal of the second transistor of the clamping circuit.

9. The memory circuit of claim 8, wherein the gate terminal of the first transistor is electrically connected to the drain terminal of the second transistor of the clamping circuit.

10. The memory circuit of claim 6, wherein the predetermined bias is determined based on the length of the second conductive line.

11. A memory circuit, comprising:
a plurality of word lines;
a word line driver electrically connected to the word lines, the word line driver comprising:
  a plurality of first electronic components; and
  a plurality of second electronic components each having a first terminal and a second terminal, wherein the first terminal of each of the second electronic components is electrically connected to a respective first electronic component of the plurality of first electronic components, and to a respective word line of the plurality of word lines;
a first conductive line electrically connected to the second terminal of each of the second electronic components, wherein the first conductive line has a length proportional to the number of the word lines; and
a clamping circuit electrically connected to the first conductive line at a node, wherein the clamping circuit comprises:
  a second conductive line having a first terminal and a second terminal opposite to the first terminal;
  a delay chain having a first terminal configured to receive a first clock signal and a second terminal electrically connected to the first terminal of the second conductive line, and
  a logic circuit configured to provide a reset signal based on the first clock signal and a second clock signal from the second terminal of the second conductive line.

12. The memory circuit of claim 11, further comprising a plurality of input/output circuits (I/Os), wherein the second conductive line has a second length proportional to the numbers of the I/Os.

13. The memory circuit of claim 11, wherein the clamping circuit is configured to clamp the first conductive line at a predetermined bias at a standby mode of the memory circuit.

14. The memory circuit of claim 11, wherein the clamping circuit comprises a transistor having a drain terminal electrically connected to the first conductive line, a source terminal electrically connected to ground, and a gate terminal configured to receive the reset signal.

15. The memory circuit of claim 11, wherein a curve of a transition of a potential of one word line of the plurality of word lines has a plurality of humps.

16. A memory circuit, comprising:
a plurality of bit lines;
a plurality of word lines;
a first conductive line electrically connected to the word lines, wherein the first conductive line has a first length proportional to the numbers of the word lines;
a second conductive line having a second length proportional to the number of the bit lines; and
a clamping circuit configured to clamp the first conductive line at a predetermined bias at a standby mode of the memory circuit,
wherein the clamping circuit is electrically connected to the second conductive line, wherein the predetermined bias is determined based on the length of the second conductive line.

17. The memory circuit of claim 16, further comprising a word line driver electrically connected to the word lines and the first conductive line.

18. The memory circuit of claim 17, wherein the word line driver includes a switch configured to establish an electrical connection between the first conductive line and one of the word lines.

19. The memory circuit of claim 18, further comprising a plurality of memory cells connected to the plurality of bit lines and plurality of word lines, wherein each of the memory cells comprises a static random access memory (SRAM) cell.

20. The memory circuit of claim 18, further comprising a plurality of I/O blocks connected to the bit lines, wherein the number of the I/O blocks is proportional to the number of the bit lines.

* * * * *